United States Patent
Kirsch et al.

(10) Patent No.: US 11,418,874 B2
(45) Date of Patent: Aug. 16, 2022

(54) TECHNIQUES FOR SHARING STEREO SOUND BETWEEN MULTIPLE USERS

(71) Applicant: HARMAN INTERNATIONAL INDUSTRIES, INC., Stamford, CT (US)

(72) Inventors: James M. Kirsch, Salt Lake City, UT (US); Ajay Iyer, Murray, UT (US); Branden Sheffield, Saratoga Springs, UT (US)

(73) Assignee: HARMAN INTERNATIONAL INDUSTRIES, INC., Stamford, CT (US)

( * ) Notice: Subject to any disclaimer, the term of this patent is extended or adjusted under 35 U.S.C. 154(b) by 191 days.

(21) Appl. No.: 14/634,687

(22) Filed: Feb. 27, 2015

(65) Prior Publication Data

US 2016/0255436 A1 Sep. 1, 2016

(51) Int. Cl.
*H04R 1/10* (2006.01)
*H04R 3/00* (2006.01)
(Continued)

(52) U.S. Cl.
CPC .......... *H04R 3/005* (2013.01); *G10L 21/0208* (2013.01); *H03G 3/32* (2013.01);
(Continued)

(58) Field of Classification Search
CPC .............................. H04R 1/1041; H04R 5/033
(Continued)

(56) References Cited

U.S. PATENT DOCUMENTS 4,677,674 A * 6/1987 Snyder .................. H04H 60/04
324/76.23
5,228,093 A 7/1993 Agnello
(Continued)

FOREIGN PATENT DOCUMENTS

CN 102350970 A 2/2012
CN 105637892 A 6/2016
(Continued)

OTHER PUBLICATIONS

International Search Report having Application No. PCT/US2016/015460, dated May 13, 2016, 13 pages.
(Continued)

*Primary Examiner* — Katherine A Faley
(74) *Attorney, Agent, or Firm* — Artegis Law Group, LLP

(57) ABSTRACT

A first digital signal processor (DSP) associated with a first user outputs audio to the first user via first headphones, and captures speech from the first user via a first microphone. Similarly, a second DSP associated with a second user outputs audio to the second user via second headphones, and captures speech from the second user via a second microphone. The first DSP is coupled to the second DSP in order to allow the first and second users to share music and communicate with one another. The first user may speak into the first microphone, and the first and second DSPs may then interoperate to output that speech to the second user without substantially disrupting audio output to the second user. Each of the first and second users may also select between first and second audio sources that may be coupled to the first and second DSPs, respectively.

3 Claims, 10 Drawing Sheets

(51) Int. Cl.
*H03G 3/32* (2006.01)
*H04R 5/033* (2006.01)
*G10L 21/0208* (2013.01)
*H03G 7/00* (2006.01)
*H04R 3/02* (2006.01)
*H04R 27/00* (2006.01)

(52) U.S. Cl.
CPC .............. *H03G 7/002* (2013.01); *H04R 5/033* (2013.01); *G10L 2021/02082* (2013.01); *H04R 3/02* (2013.01); *H04R 27/00* (2013.01); *H04R 2420/03* (2013.01); *H04R 2420/07* (2013.01)

(58) Field of Classification Search
USPC .................................................... 381/74, 309
See application file for complete search history.

(56) References Cited

U.S. PATENT DOCUMENTS

| | | | | |
|---|---|---|---|---|
| 5,982,901 | A | * | 11/1999 | Kane ................ G11B 20/00992 348/614 |
| 6,493,450 | B1 | | 12/2002 | Scheuer et al. |
| 8,295,500 | B2 | * | 10/2012 | Shin ....................... H04R 1/403 381/304 |
| 2003/0235294 | A1 | * | 12/2003 | Dyba ....................... H04B 3/23 379/406.01 |
| 2005/0032500 | A1 | | 2/2005 | Nashif et al. |
| 2005/0160270 | A1 | * | 7/2005 | Goldberg ............. G10H 1/0025 713/176 |
| 2008/0170740 | A1 | | 7/2008 | Gantz |
| 2011/0026745 | A1 | | 2/2011 | Said et al. |
| 2011/0216913 | A1 | | 9/2011 | Bonne |
| 2012/0275603 | A1 | | 11/2012 | Wedge |
| 2014/0119552 | A1 | | 5/2014 | Beaucoup |
| 2014/0161274 | A1 | | 6/2014 | Singamsetty et al. |
| 2014/0363008 | A1 | | 12/2014 | Chen et al. |
| 2015/0063601 | A1 | * | 3/2015 | Briggs ................. H04R 1/1041 381/110 |
| 2016/0036962 | A1 | * | 2/2016 | Rand .................... H04R 1/1041 455/418 |

FOREIGN PATENT DOCUMENTS

| | | |
|---|---|---|
| JP | 2003-249996 A | 9/2003 |
| JP | 2003-263872 A | 9/2003 |
| JP | 2006237839 A | 9/2006 |
| WO | 2014/161091 A1 | 10/2014 |

OTHER PUBLICATIONS

Partial Supplementary European Search Report for application No. 16756032.5 dated Sep. 26, 2018.
Supplementary European search report for application No. 16756032.5 dated Jan. 18, 2019.

* cited by examiner

TECHNIQUES FOR SHARING STEREO SOUND BETWEEN MULTIPLE USERS

BACKGROUND

Field of the Disclosed Embodiments

The disclosed embodiments relate generally to audio devices and, more specifically, to techniques for sharing stereo sound between multiple users.

DESCRIPTION OF THE RELATED ART

A conventional personal audio device typically includes an audio jack configured to output an audio signal to a set of headphones. For example, an MP3 player could include a 3.5 mm audio jack to which over-ear headphones or in-ear earbuds can be coupled. Personal audio devices generally output stereo audio signals, meaning that the audio jack of such a device simultaneously outputs a left audio signal associated with a left channel and a right audio signal associated with a right channel. When headphones are coupled to the audio jack, a left side headphone outputs the left audio signal, and a right side headphone outputs the right audio signal. When a user wears the set of headphones, the user hears the left audio signal with the left ear, and the right audio signal with the right ear.

Maintaining the left-right directionality described above is important because audio is oftentimes panned between the left and right channels. For example, when mixing the audio for a piece of music, a sound engineer may pan certain instruments to the left channel and pan other instruments to the right channel. This type of panning may reflect an aesthetic choice intended to augment the listening experience for that piece of music. In another example, when mixing audio for a movie, a sound engineer may pan certain sound effects between the left and right channels to cause those effects to appear to emanate from a particular direction. For example, if the movie shows a character closing a door on the right side of the movie screen, then the sound engineer could pan a sound effect for the closing door to the right channel. This type of panning is meant to cause the viewing experience for the movie to be more realistic.

When conventional headphones are worn in the left and right ears of a user, the stereo nature of audio output by those headphones is preserved. However, users oftentimes share headphones with one another for various reasons. For example, two friends could wish to listen to the same music, but have only one set of headphones. A common solution is that one friend uses the left headphone, while the other friend uses the right headphone. In another example, suppose a couple wishes to watch a movie together on a laptop computer without disturbing others. The couple may employ the same solution mentioned above and split the left and right headphones between the respective left and right ears.

One problem with the scenarios described above is that the stereo nature of the audio is disrupted, so each user only experiences half of the intended audio. Consequently, each user may only experience a subset of the instruments associated with a given piece of music, or only hear parts of the sound associated with a movie. In scenarios where the audio is panned completely to one side, one user may hear all of the sound while the other user hears nothing. Generally, splitting stereo sound in such a fashion severely disrupts the intended user experience. Another issue associated with splitting stereo sound is that both users are required to listen to audio at the same volume, despite potentially having different volume preferences.

Further, in situations where users wish to share audio with one another, and actually have separate sets of headphones, a Y-splitter may be employed that outputs two separate stereo signals. With the Y-splitter approach, each user wears a different set of headphones that outputs stereo sound. However, in situations where those users wish to share the experience of listening to audio, those users cannot effectively communicate with one another because each user has both ears covered or plugged by headphones.

As the foregoing illustrates, conventional headphones cannot be shared between users without disrupting the stereo nature of certain audio signals. Solutions that rely on multiple headphones necessarily isolate the users from one another, thereby defeating the original purpose of sharing the listening experience. Accordingly, what would be useful is a technique for sharing stereo sound between multiple users that allows communication between those users.

SUMMARY

One or more embodiments set forth include a computer-implemented method for generating an audio signal, including receiving a first signal from a first audio source, causing an output element associated with the first user to output the first signal, receiving a second signal from an input element associated with a second user, combining the first signal with the second signal to produce a combined signal, and causing the output element associated with the first user to output the combined signal.

At least one advantage of the disclosed embodiments is that two users who wish to listen to the same stereo audio may do so without disrupting the stereo nature of that audio. In addition, those users may remain in communication with one another despite having both the left and right ears occupied by headphones.

BRIEF DESCRIPTION OF THE SEVERAL VIEWS OF THE DRAWINGS

So that the manner in which the recited features of the one more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the invention subsumes other embodiments as well.

DETAILED DESCRIPTION

In the following description, numerous specific details are set forth to provide a more thorough understanding of certain specific embodiments. However, it will be apparent to one of skill in the art that other embodiments may be practiced without one or more of these specific details or with additional specific details.

Sharing Stereo Audio Signals from a Single Audio Source

Figure 1:
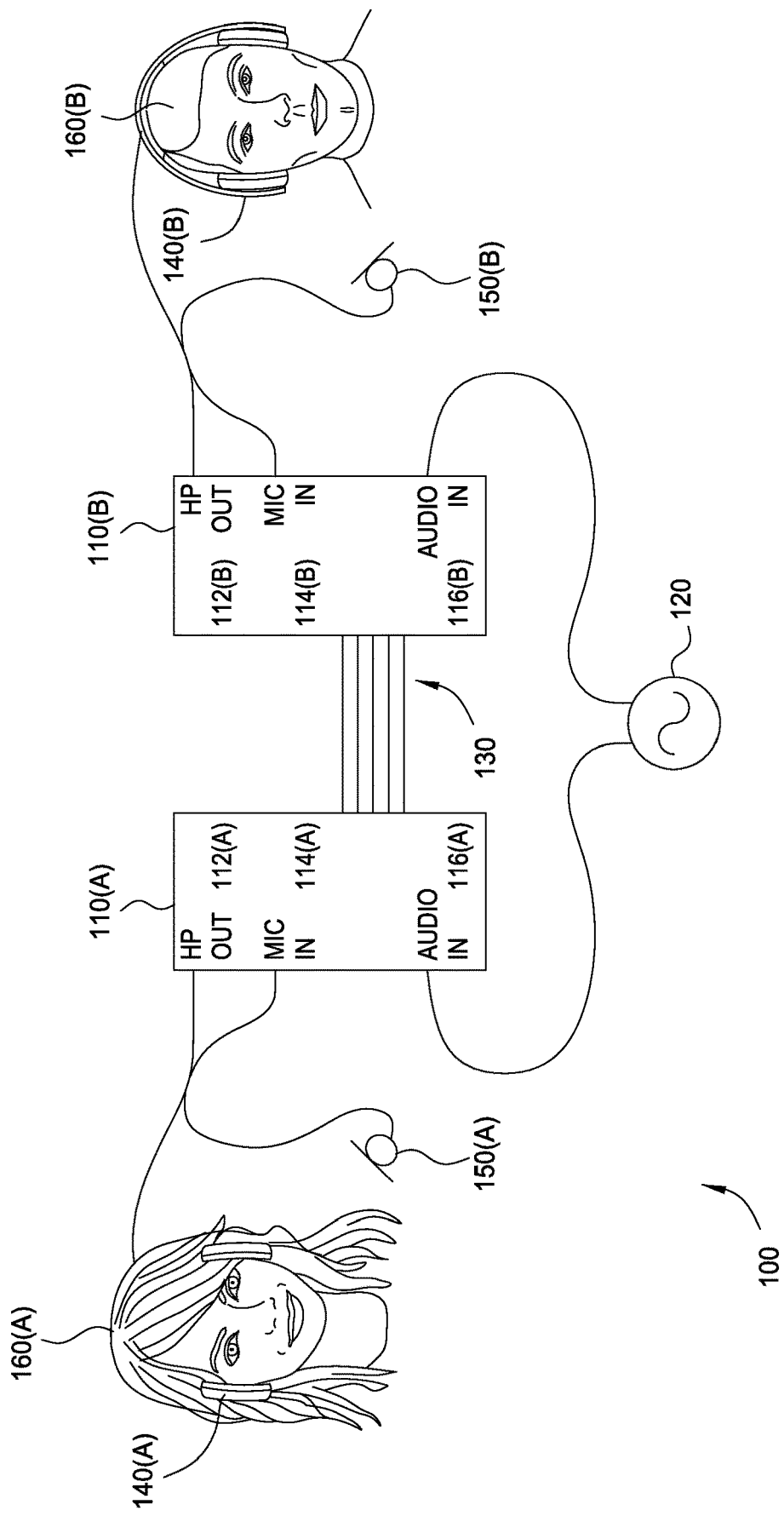
FIG. 1 illustrates a system configured to share audio and speech signals between users, according to various embodiments.
Figure 2:
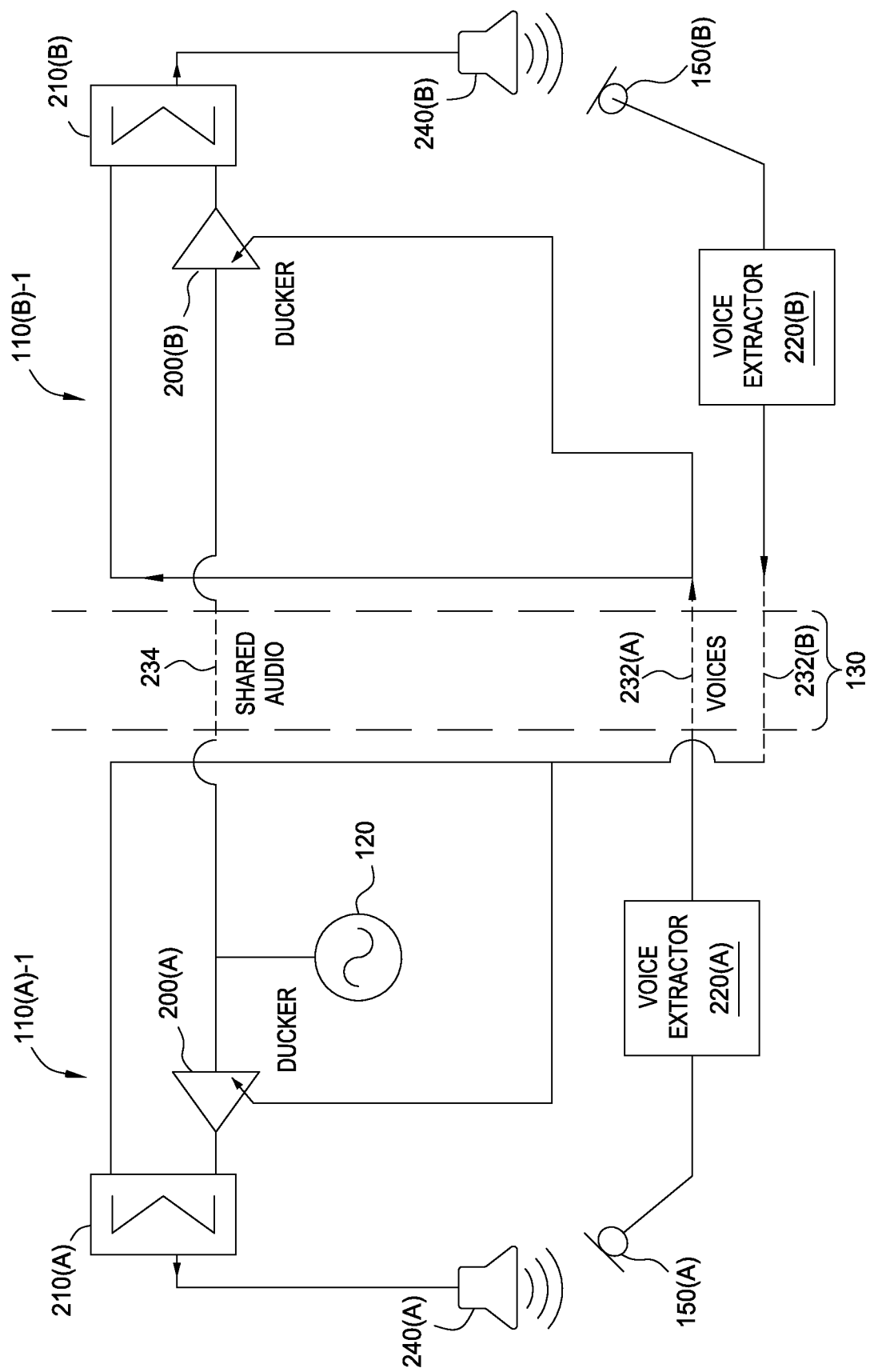
FIG. 2 illustrates an implementation where the digital signal processors (DSPs) of FIG. 1 are configured to duck audio signals in response to speech signals, according to various embodiments.
Figure 3:
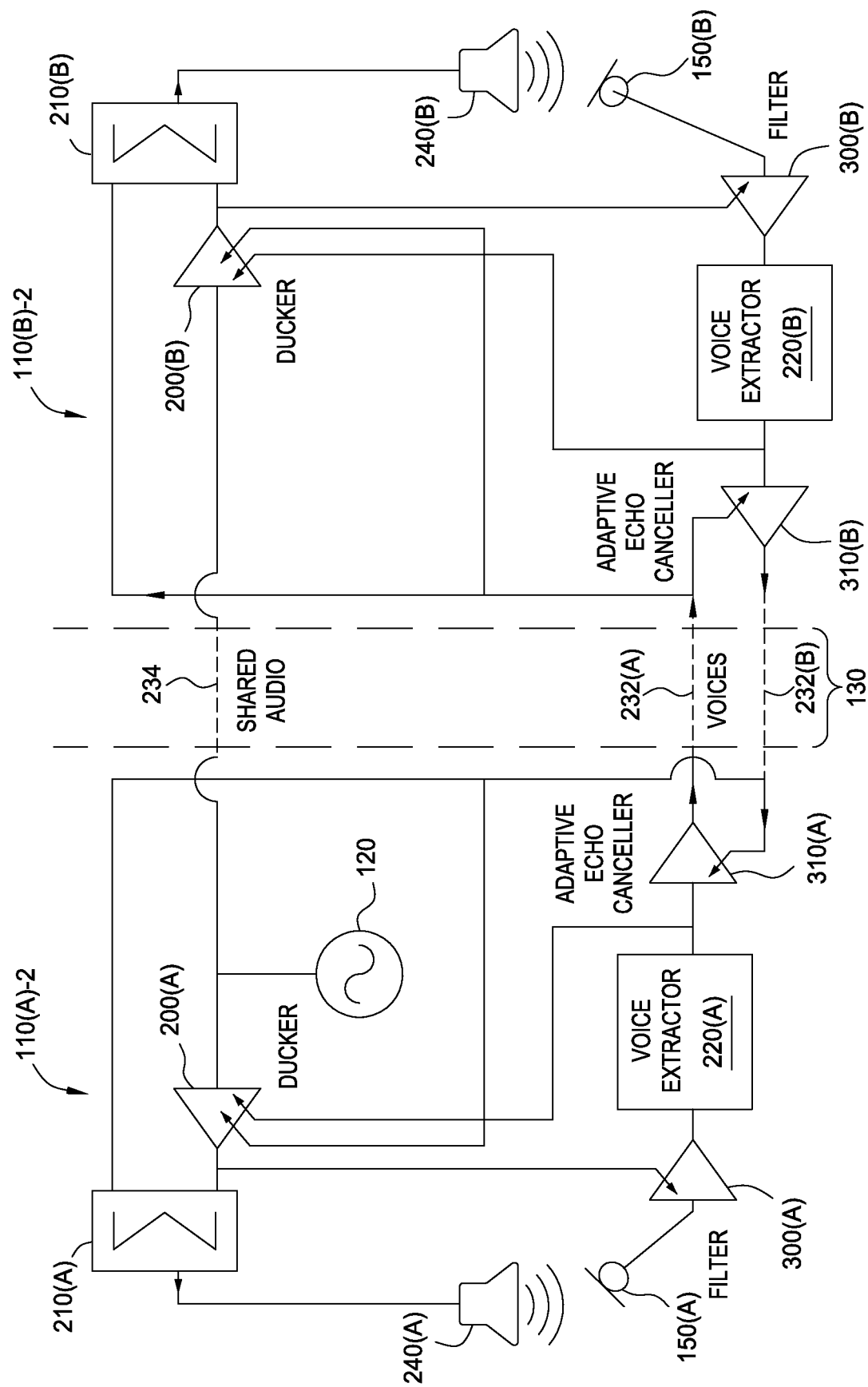
FIG. 3 illustrates another implementation where the DSPs of FIG. 1 are configured to cancel echoing caused by microphone feedback, according to various embodiments.
Figure 4:
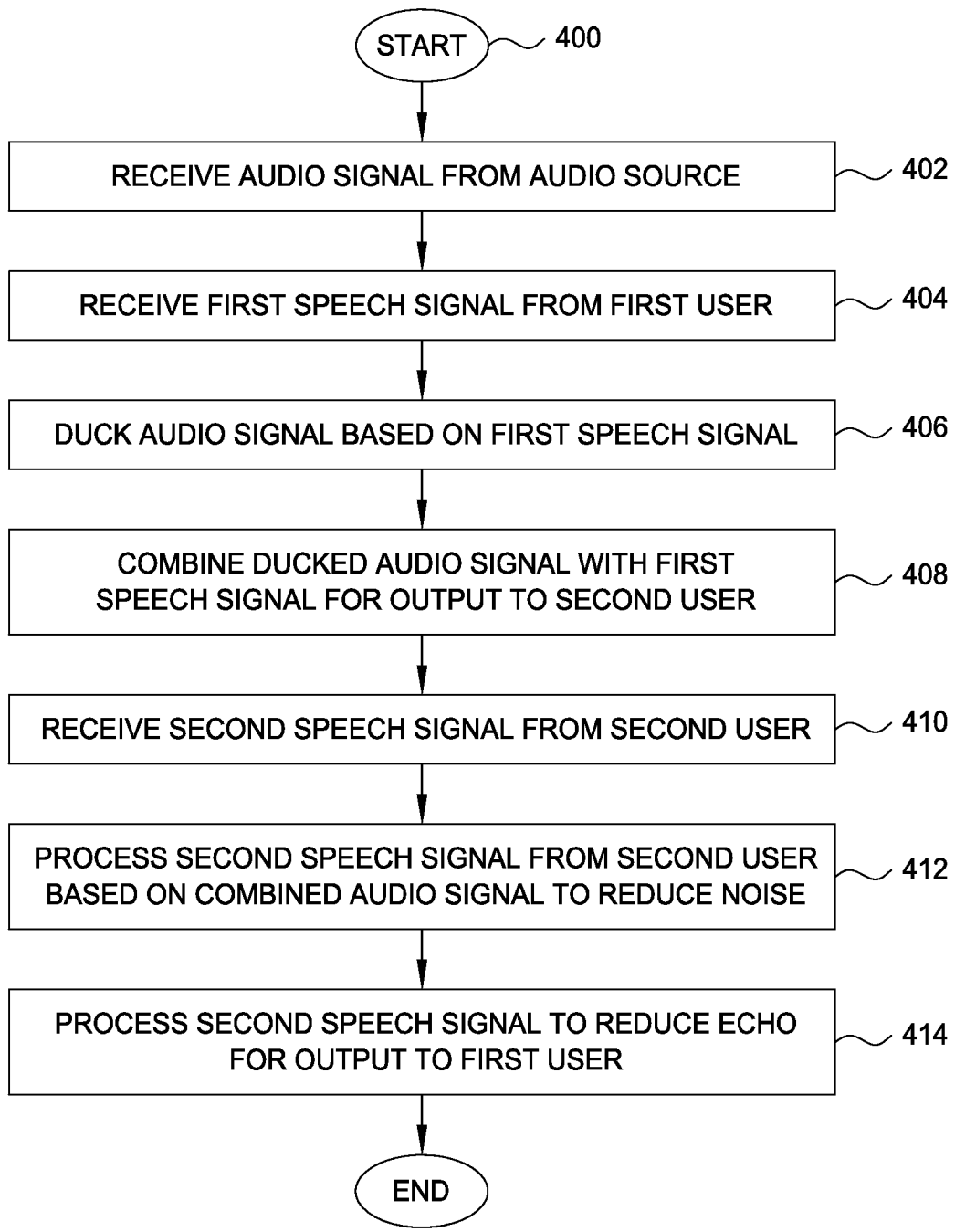
FIG. 4 is a flow diagram of method steps for sharing audio and speech signals between users, according to various embodiments.
Figure 5:
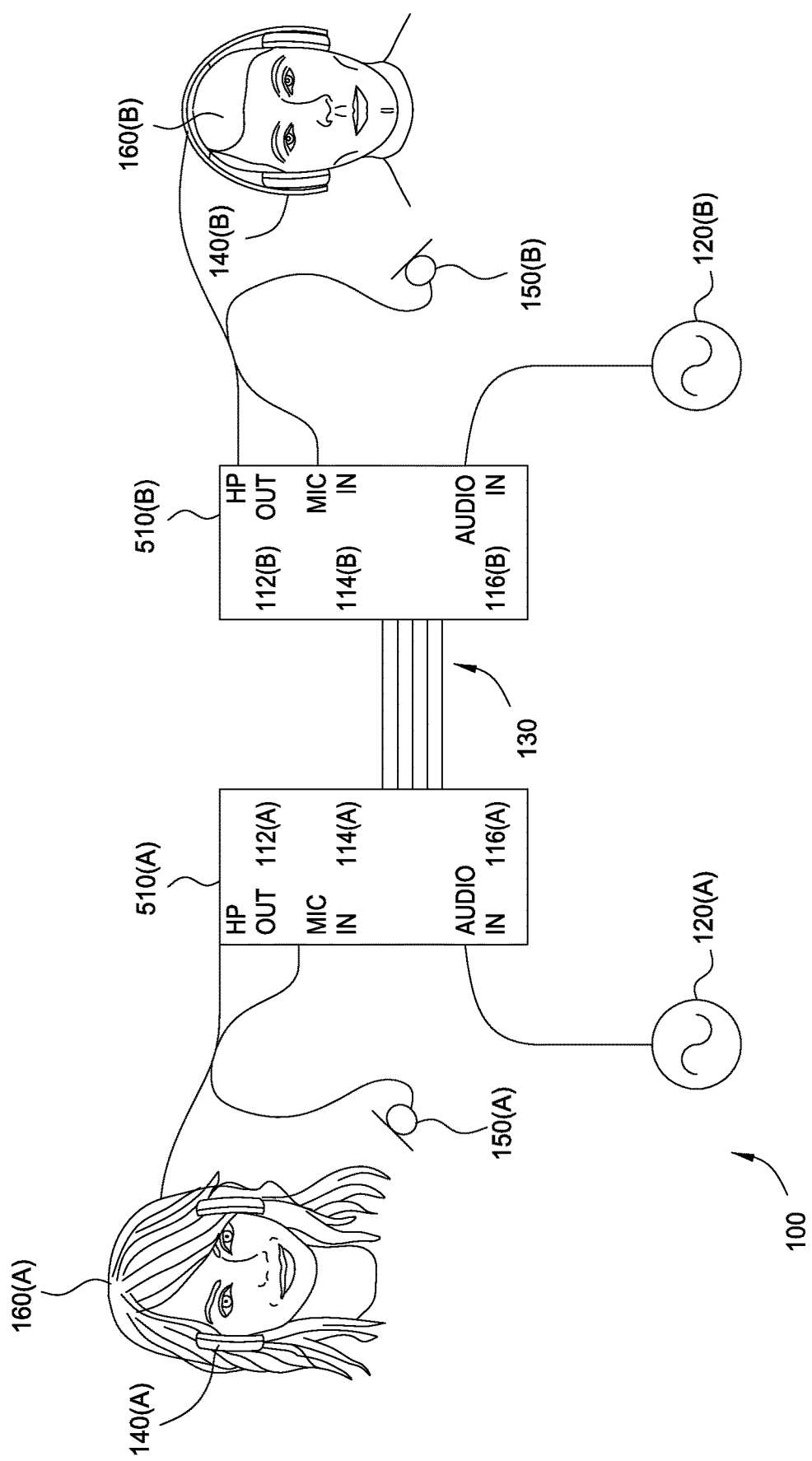
FIG. 5 illustrates the system of FIG. 1 configured to selectively share multiple audio sources and speech signals between users, according to various embodiments.

FIG. 1 illustrates a system configured to share audio and speech signals between users, according to various embodiments. As shown, system 100 includes digital signal processors (DSPs) 110(A) and 110(B). DSPs 110(A) and 110(B) represent similar instances of a unit that is configured to allow two different users to listen to the same stereo audio source, while allowing those users to remain in verbal communication with one another. FIG. 1 provides a general overview of DSPs 110(A) and 110(B) when coupled to a single audio source. FIGS. 2-4 describe the operation of various embodiments of DSPs 110(A) and 110(B) when coupled to a single audio source. FIG. 5 provides an overview of DSPs 110(A) and 110(B) when coupled to multiple audio sources. FIGS. 6-9 describe the operation of various embodiments of DSPs 110(A) and 110(B) when coupled to multiple audio sources.

In FIG. 1, DSPs 110(A) and 110(B) are coupled to audio source 120 and coupled together via communication link 130. DSPs 110(A) and 110(B) are also coupled to headphones 140(A) and 140(B), respectively, and microphones 150(A) and 150(B), respectively. User 160(A) wears headphones 140(A) and microphone 150(A), while user 160(B) wears headphones 140(B) and microphone 150(B).

In the following disclosure, similar instances of like elements are denoted with similar numbers and with different alphanumeric characters, depending on the particular user with which those elements are associated. For example, and without limitation, each element associated with user 160(A) is labeled using an "A" in parenthesis, while each element associated with user 160(B) is labeled using a "B" in parenthesis. Elements having similar numeric labels, with different alphanumeric portions in parenthesis, may reflect different instances of similar elements.

DSP 110(A) includes headphone output 112(A), shown as "HP OUT" 112(A), that is coupled to headphones 140(A). DSP 110(A) also includes a microphone input, shown as "MIC IN" 114(A), that is coupled to microphone 150(A). In addition, DSP 110(A) includes an audio input, shown as "AUDIO IN" 116(A), that is coupled to audio source 120. Similarly, DSP 110(B) includes headphone output 112(B) coupled to headphones 140(B), microphone input 114(B) coupled to microphone 150(B), and an audio input 116(B) coupled to audio source 120.

DSP 110(A) is configured to receive audio from audio source 120 via audio input 116(A) and to then output that audio to user 160(A) via headphones output 112(A) and headphones 140(A). DSP 110(A) is also configured to receive speech signals from microphone 150(A) via microphone input 114(A) and to then transmit those speech signals to DSP 110(B) for output to user 160(B), thereby allowing user 160(A) to speak to user 160(B). In like fashion, DSP 110(B) is configured to receive audio from audio source 120 via audio input 116(B) and to then output that audio to user 160(B) via headphones output 112(B) and headphones 140(B). DSP 110(B) is also configured to receive speech signals from microphone 150(B) via microphone input 114(B) and to then transmit those speech signals to DSP 110(A) for output to user 160(A), thereby allowing user 160(B) to speak to user 160(A). With this approach, when DSPs 110(A) and 110(B) are coupled together via communication link 130 and both coupled to music source 120, users 160(A) and 160(B) may both listen to the stereo audio provided by audio source 120 while retaining the ability to verbally communicate with one another.

Persons skilled in the art will recognize that the various elements shown in FIG. 1 may be implemented by a wide variety of different types of hardware and/or software. For example, and without limitation, each of DSPs 110(A) and 110(B) could be implemented by a smartphone executing a signal processing application, hardware configured to execute firmware including microcode, a dedicated hardware unit, and so forth. Further, and without limitation, an mp3 player, stereo system, computer system audio player, and so forth, could implement audio source 120. Additionally, communication link 130 could be a bidirectional ribbon connector or a wireless communication link, for example and without limitation. Headphones 140(A) and 140(B) could be, e.g., over-ear headphones, in-ear earbuds, bone conduction headphones, and so forth, without limitation. Microphones 150(A) and 150(B) could be traditional acoustic microphones, bone conduction microphones, or any other technically feasible audio transduction device or input element, without limitation.

In addition, those skilled in the art will also understand that the various elements shown in FIG. 1 may be integrated with one another according to a wide range of different architectures. For example, and without limitation, DSPs 110(A) and 110(B) could be integrated into headphones 140(A) and 140(B), respectively, or coupled thereto in the fashion shown. A single unit could execute the functionality of DSPs 110(A) and 110(B) or those DSPs could be combined into a single DSP. DSPs 110(A) and 110(B) could also be integrated into audio source 120, or in situations where multiple audio sources are used, as described below in conjunction with FIGS. 5-9, each such audio source could include a different instance of DSP 110, without limitation. Further, microphones 150(A) and 150(B) could be integrated into headphones 140(A) and 140(B), respectively, or coupled to a wire associated with those headphones, among other possibilities, and without limitation.

FIG. 2 illustrates an implementation where the DSPs of FIG. 1 are configured to duck audio signals in response to speech signals, according to various embodiments. In FIG. 2, microphones 150(A) and 150(B) generally reside external to the ears of users 160(A) and 160(B), respectively. For example, and without limitation, microphones 150(A) and 150(B) could be disposed inline with wires coupling headphones 140(A) and 140(B) to DSPs 110(A) and 110(B), respectively. Persons skilled in the art will understand that alternative implementations of microphones 150(A) and 150(B) also fall within the scope of the present invention, as described in greater detail below.

As shown, DSP 110(A)-1 includes a ducker 200(A), a sum unit 210(A), and a voice extractor 220(A), and is coupled to an output element 240(A). Voice extractor 220(A) may include any combinations of a high-pass filter (HPF), a gate, a neural network, or any other technically feasible circuitry configured to extract voice signals from microphone 150(A). Output element 240(A) may be a speaker included within headphones 140(A) shown in FIG. 1. Similarly, DSP 110(B)-1 includes a ducker 200(B), a sum unit 210(B), and a voice extractor 220(B), and is coupled to an output element 240(B). Voice extractor 220(B) may include any combinations of a high-pass filter (HPF), a gate, a neural network, or any other technically feasible circuitry configured to extract voice signals from microphone 150(B). Output element 240(B) may be a speaker included within headphones 140(B) shown in FIG. 1. In certain embodiments, DSPs 110(A) and 110(B) are integrated into headphones 140(A) and 140(B), respectively. In such embodiments, output elements 240(A) and 240(B) may be included within, or coupled directly to, DSPs 110(A) and 110(B), respectively. Communication link 130 includes sublink 232(A) that is configured to transport voice from user 160(A) to DSP 110(B)-1, sublink 232(B) that is configured to transport voice from user 160(B) to DSP 110(A)-1, and sublink 234 that is configured to transport shared audio from audio source 120 to users 160(A) and 160(B).

In operation, audio source 120 outputs audio to output elements 240(A) and 240(B) via duckers 200(A) and 200(B) and sum units 210(A) and 210(B). Duckers 200(A) and 200(B) are configured to temporarily interrupt at least a portion of the audio derived from audio source 120 in order to incorporate speech signals received from microphones 150(B) and 150(A), respectively.

For example, when user 160(B) speaks into microphone 150(B), voice extractor 220(B) pre-processes a speech signal transduced by microphone 150(B) and then outputs the speech signal along connection 232(B) to ducker 200(A). Voice extractor 220(B) generally reduces stray sounds associated with the environment and with user 160(B). Ducker 200(A) then temporarily ducks some or all of the audio received from audio source 120 in order to accommodate that speech signal. In one embodiment, ducker 200(A) is a full band ducker.

In another embodiment, ducker 200(A) only ducks a mid range portion of the audio signal in order to accommodate the mid range frequencies generally associated with speech signals. In another embodiment, an auxiliary filter separates the speech signal into different ranges on frequencies, including low range frequencies, mid range frequencies, and high range frequencies, and then selectively ducks certain frequencies in the audio signal in proportion to the magnitudes of those different frequency ranges in the speech signal. In the context of this disclosure, a low frequency range signal may include frequencies below 400 Hz, a mid range signal may include frequencies between 400 Hz and 4 kHz, and a high range signal may include frequencies above 4 kHz.

Sum unit 210(A) then combines the ducked audio signal with the speech signal for output to user 160(A). Since ducker 200(A) reduces certain frequencies in the audio signal based on corresponding frequencies in the speech signal, as described above, the ducked audio signal can be safely combined with the speech signal without substantially inducing constructive interference between like frequencies. Thus, user 160(A) may hear intelligible speech from user 160(B), while continuing to listen to audio from audio source 120. When user 160(A) speaks into microphone 150(A), an analogous process occurs, with ducker 200(B) temporarily ducking at least a portion of the audio signal received from audio source 120 to accommodate a speech signal received from user 160(A). In certain embodiments, duckers 200(A) and 200(B) may be omitted, depending on the signal-to noise ratio associated with microphones 150(A) and 150(B).

With this approach, users 160(A) and 160(B) can listen to the same stereo audio source and communicate with one another without interference between that audio source and speech signals. Again, duckers 200(A) and 200(B) are configured to duck the audio signal from audio source 120 to reduce the amplitude of frequencies normally associated with human speech, so that when one of users 160 speaks, the frequencies associated with that speech are not interfered with excessively.

In situations where microphones 150(A) and 150(B) reside within the respective ear canals of users 160(A) and 160(B), as the case may be, the implementations of DSPs 110(A) and 110(B) shown in FIG. 2 may introduce feedback between output elements 240(A) and 240(B) and microphones 150(A) and 150(B), respectively, that may induce echo effects. For example, when user 160(B) speaks into microphone 150(B), and output element 240(A) in turn outputs an audio signal that incorporates the speech signal, microphone 150(A) may pickup that audio signal and then transmit the signal back to output element 240(B). When this situation occurs, user 160(B) may hear a delayed version of the speech just spoken into microphone 150(B) (i.e., an echo). The aforementioned situation could occur when, for example, and without limitation, bone microphones are used to implement microphones 150(A) and 150(B). To mitigate echo, DSPs 110(A) and 110(B) may include additional circuitry, as shown in the embodiments described below in conjunction with FIG. 3.

FIG. 3 illustrates another implementation where the DSPs of FIG. 1 are configured to cancel echoing caused by microphone feedback, according to various embodiments. In FIG. 3, microphones 150(A) and 150(B) generally reside internal to the ear canals of users 160(A) and 160(B), respectively. For example, and without limitation, microphones 150(A) and 150(B) could be bone microphones disposed within headphones 140(A) and 140(B) and configured to detect vibrations within the ear canals of users 160(A) and 160(B). Persons skilled in the art will understand that alternative implementations of microphones 150(A) and 150(B) also fall within the scope of the present invention, as described in greater detail below.

As shown, DSPs 110(A)-2 and 110(B)-2 include some of the same elements as DSPs 110(A)-1 and 110(B)-2 shown in FIG. 2. DSP 110(A)-2 also now includes filter 300(A) and adaptive echo canceller 310(A), and DSP 110(B)-2 similarly now includes filter 300(B) and adaptive echo canceller 310(B).

Filters 300(A) and 300(B) may be adaptive filters or spectral subtractors. Filters 300(A) and 300(B) are configured to reduce or remove the ducked audio signal from the microphone signal transduced by microphones 150(A) and 150(B), respectively. Thus, in situations where the output of output elements 240(A) or 240(B) bleeds into microphones 150(A) or 150(B), respectively, that output may be minimized. In other words, filter 300(A) reduces the sound of audio from the microphone signal captured by microphone 150(A), so that user 160(B) mostly hears speech from user 160(A), and not music. Filter 300(B) performs an analogous function. This approach is especially useful when microphones 150(A) and/or 150(B) are bone conduction microphones that may pickup the output of output elements 240(A) and/or 240(B), respectively, more easily.

Adaptive echo cancellers 310(A) and 310(B) are wired to one another so that the output of adaptive echo canceller 310(A) controls the input to adaptive echo canceller 310(B), and the output of adaptive echo canceller 310(B) controls the input to adaptive echo canceller 310(A). With this configuration, feedback between output elements 240(A) and/or 240(B) and microphones 150(A) and/or 150(B), may be reduced or eliminated, thereby mitigating echo. For example, and without limitation, when user 160(B) speaks into microphone 150(B), and output element 240(A) then outputs that speech signal to user 160(A), microphone 150(A) could potentially pickup that speech signal. However, that same speech signal also drives adaptive echo canceller 310(A), which then cancels the speech signal from the output of microphone 150(A). In one embodiment, the outputs of voice extractors 220(A) and 220(B) also drive duckers 200(A) and 200(B), causing any stray audio signals (e.g. music, without limitation) to be eliminated from the audio signal output by audio source 120 prior to the input captured by microphones 150(B) and 150(A), respectively, being incorporated into that signal. In the embodiment described herein, duckers 200(A) and 200(B) may be full band duckers configured to duck audio across low, mid, and high ranges.

Persons skilled in the art will recognize that the configuration described herein may be applicable to a wide variety of different types of hardware, including, for example and without limitation, acoustic speakers and microphones as well as bone conduction speakers and microphones. The various techniques described thus far are also described in stepwise fashion below in conjunction with FIG. 4.

FIG. 4 is a flow diagram of method steps for sharing audio and speech signals between users, according to various embodiments. Although the method steps are described in conjunction with the systems of FIGS. 1-3, persons skilled in the art will understand that any system configured to perform the method steps, in any order, is within the scope of the present invention.

In practice, certain implementations of DSP 110(A) or 110(B) may perform specific method steps discussed below. For example, and without limitation, DSPs 110(A)-1 and 110(B)-1 and 110(A)-2 and 110(B)-2 may perform steps 402, 404, 406, 408, and 410. However, since only DSPs 110(A)-2 and 110(B)-2 include filters 300(A) and 300(B) and adaptive echo cancellers 310(A) and 310(B), respectively, only those DSPs may perform steps 412 and 414. Persons skilled in the art will recognize that certain method steps are applicable to specific implementations of DSPs 110(A) and 110(B). Additionally, either of DSPs 110(A) and 110(B) may perform the method steps described below, although for simplicity with respect to describing FIG. 4, the method steps are discussed as being performed only by DSP 110(A).

As shown, a method 400 begins at step 402, where DSP 110(A) receives an audio signal from audio source 120. Audio source 120 could be an MP3 player, a stereo system output, a laptop computer audio output, and so forth, without limitation.

At step 404, DSP 110(A) receives a speech signal from DSP 110(B) captured by microphone 150(B) that reflects speech of user 160(B). Microphone 150(B) could be, for example, a traditional air conduction microphone, a bone conduction microphone, and so forth, without limitation.

At step 406, ducker 200(A) ducks the audio signal received at step 402 based on the speech signal received at step 404. Ducker 200(A) may simply interrupt that audio signal while the speech signal is received, or ducker 200(A) may perform more complex ducking based on the frequencies associated with the speech signal. For example, ducker 200(A) could duck only mid-range frequencies associated with the audio signal in order to accommodate the mid-range frequencies commonly found in speech signals, without limitation. Alternatively, an auxiliary filter could separate the speech signal into different ranges on frequencies, including low range frequencies, mid range frequencies, and high range frequencies, and then selectively duck corresponding frequencies in the audio signal based on the magnitudes of those different frequency ranges.

At step 408, sum unit 210(A) combines the ducked audio signal generated at step 406 with the audio signal received at step 402 to generate a combined audio signal. Output element 240(A) within headphones 140(A) outputs the combined audio signal to user 160(A).

At step 410, microphone 150(A) receives a second speech signal that originates from user 160(A). Microphone 150(A) could be, for example, a traditional air conduction microphone, a bone conduction microphone, and so forth, without limitation.

At step 412, filter 300(A) processes the second speech signal to reduce noise and other interference that may be caused by bleed-through from output element 240(A) within headphones 140(A). Specifically, in certain situations the audio signal may travel from output element 240(A) to microphone 150(A), potentially causing interference. However, because filter 300(A) is controlled by that audio signal, filter 300(A) can reduce interference associated with the audio signal.

At step 414, adaptive echo canceller 310(A) processes the speech signal to reduce echo that may have been introduced into that speech signal. Echo could potentially occur when the speech signal is output to DSP 110(B) and then travels from output element 240(B), through microphone 150(B), and then back to DSP 110(A) for output to user 160(A). In this situation user 160(A) could possibly hear an echo while speaking. Adaptive echo canceller 310(A) may reduce or eliminate this potential echo because the input to that echo canceller is driven by the output of DSP 110(B). Accordingly, the output of DSP 110(B) is removed from the output of DSP 110(A) prior to transmission to DSP 110(B).

As mentioned above, specific embodiments of DSPs 110(A) and 110(B) may be configured to perform some or all of the steps of the method 400. For example, and without limitation, since DSPs 110(A)-2 and 110(B)-2 include filters 300(A) and 300(B), respectively, those DSPs could perform step 412. Likewise, since DSPs 110(A)-2 and 110(B)-2 include adaptive echo cancellers 310(A) and 310(B), respectively, those DSPs could perform step 414, without limitation. By implementing the techniques described herein, DSPs 110(A) and 110(B) allow users 160(A) and 160(B) to share music and other types of audio with one another, while preserving the stereo nature of that audio. Further, the aforementioned techniques also allow users 160(A) and 160(B) to remain in verbal communication with one another without introducing unwanted noise, feedback, and other types of interferences into the shared audio. In one embodiment, DSPs 110(A) and 110(B) provide independent volume control to users 160(A) and 160(B), respectively.

As described in greater detail below in conjunction with FIGS. 5-9, additional versions of DSPs that are similar in nature to DSPs 110(A) and 110(B) may be coupled to different audio sources, allowing each of users 160(A) and 160(B) to selectively listen to a specific audio source, while still conferring the benefits described above in conjunction with FIGS. 1-4.

Sharing Stereo Audio Signals from Multiple Audio Sources

FIG. 5 illustrates the system of FIG. 1 configured to selectively share multiple audio sources and speech signals between users, according to various embodiments. As shown, system 100 includes some of the same elements as shown in FIG. 1. However, system 100 now includes DSPs 510(A) and 510(B) that are coupled to different audio sources 120(A) and 120(B), respectively. As described in greater detail below in conjunction with FIGS. 6-9, DSPs 510(A) and 510(B) include some of the same elements as DSPs 110(A) and 110(B) of FIGS. 1-3. However, DSPs 510(A) and 510(B) also include additional circuitry that allows users 160(A) and 160(B) to share audio sources 120(A) and 120(B).

Like DSPs 110(A) and 110(B), DSPs 510(A) and 510(B) may be implemented as any combination of hardware and/or software, including, for example, an application executing on a computing device, microcode executed by a microprocessor, and so forth, without limitation. Additionally, each of DSPs 510(A) and 510(B) could be integrated into headphones 140(A) and 140(B), respectively, or integrated into music sources 120(A) and 120(B), respectively, without limitation. Each of audio sources 120(A) and 120(B) could be implemented as an mp3 player, stereo system, computer system audio output, and so forth, without limitation. Audio sources 120(A) and 120(B) may be similar or different, although each of those sources is configured to output an audio signal.

In operation, DSP 510(A) receives an audio signal from audio source 120(A) via audio input 116(A), and may then output audio based on that audio signal to user 160(A) via headphones 140(A). In doing so, DSP 510(A) may implement any of the techniques described above in conjunction with FIGS. 1-4. Similarly, DSP 510(B) receives an audio signal from audio source 120(B) via audio input 116(B), and may then output audio based on that audio signal to user 160(B) via headphones 140(B). Similar to DSP 510(A), DSP 510(B) may implement any of the techniques described above in conjunction with FIGS. 1-4.

In addition, DSPs 510(A) and 510(B) are configured to share audio signals received from the respective audio sources 120(A) and 120(B) across communication link 130. In particular, DSP 510(A) may output an audio signal received from audio source 120(A) across communication link 130 to DSP 510(B), allowing user 160(B) to listen to audio derived from audio source 120(A). In like fashion, DSP 510(B) may output an audio signal received from audio source 120(B) across communication link 130 to DSP 510(A), allowing user 160(A) to listen to audio derived from audio source 120(B).

As described in greater detail below in conjunction with FIGS. 6-7B, each of DSPs 510(A) and 510(B) includes a routing circuit that selectively routes audio from the specific audio source 120(A) or 120(B) coupled thereto or from the other DSP coupled thereto. With this approach, DSPs 510 (A) and 510(B) can be linked together, allowing users 160(A) and 160(B) to either listen to shared audio provided by one of those users, or to listen to different audio. Further, DSPs 510(A) and 510(B) may also be configured to implement the various techniques described above in conjunction with FIGS. 1-4, thereby allowing communication between users 160(A) and 160(B) with minimal feedback, interference, and so forth. Persons skilled in the art will understand that DSPs 110(A) and 110(B) of FIG. 1 may also include the routing circuit mentioned above and described in greater detail below. However, when DSPs 110(A) and 110(B) are coupled to only a single audio source, as is shown in FIGS. 1-3, such a routing circuit would not necessarily allow selective routing in the fashion described below.

Figure 6:
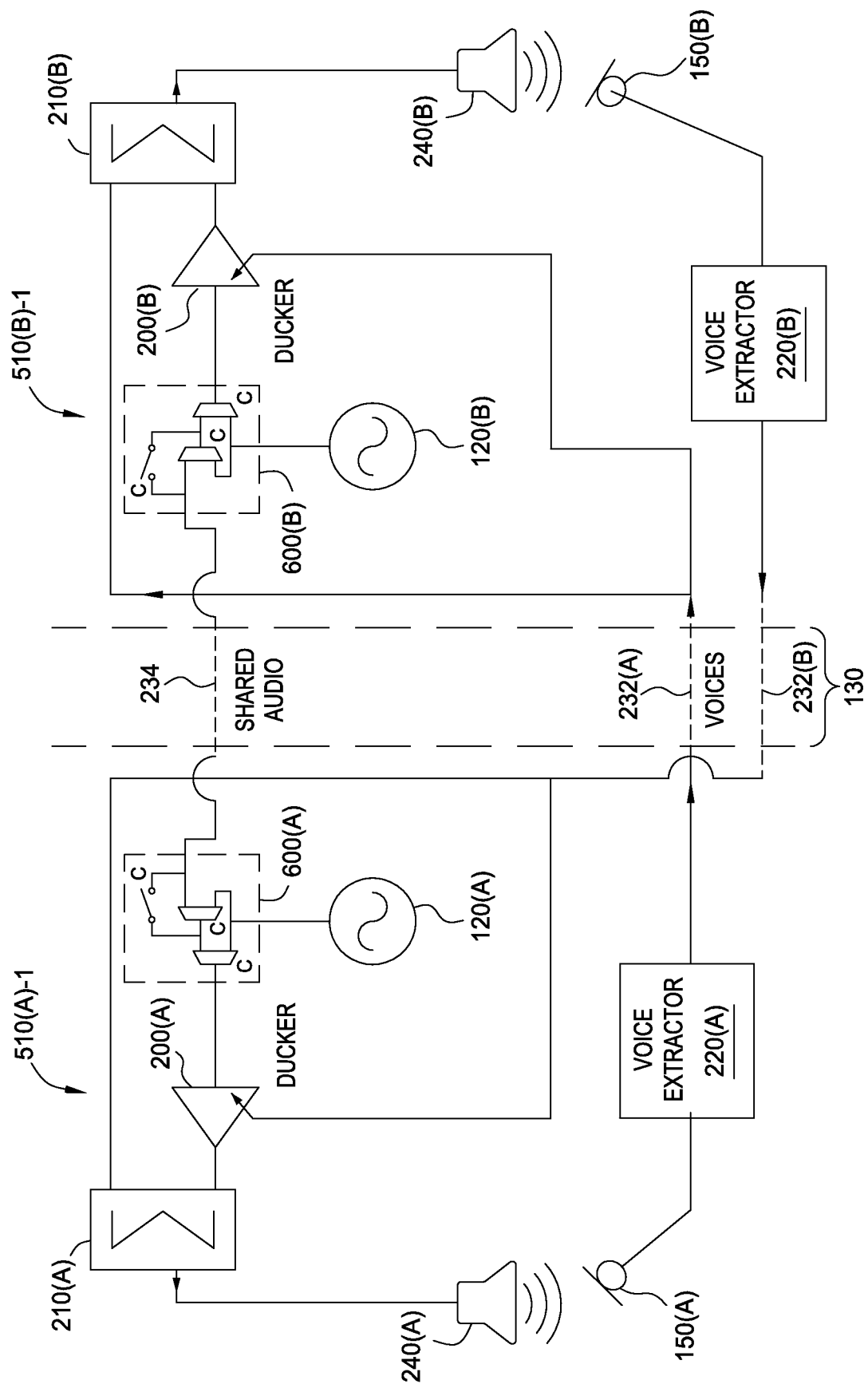
FIG. 6 illustrates an implementation where the DSPs of FIG. 5 are configured to select between different audio sources, according to various embodiments.

FIG. 6 illustrates an implementation where the DSPs of FIG. 5 are configured to select between different audio sources, according to various embodiments. In FIG. 6, microphones 150(A) and 150(B) generally reside external to the ears of users 160(A) and 160(B), respectively. For example, and without limitation, microphones 150(A) and 150(B) could be disposed inline with wires coupling headphones 140(A) and 140(B) to DSPs 110(A) and 110(B), respectively. Persons skilled in the art will understand that alternative implementations of microphones 150(A) and 150(B) also fall within the scope of the present invention.

As shown, DSPs 510(A)-1 and 510(B)-1 include some of the same elements as DSPs 110(A)-1 and 110(B)-1 shown in FIG. 2. DSP 510(A)-1 also includes routing circuit 600(A), and DSP 510(B)-1 similarly now includes routing circuit 600(B).

Routing circuit 600(A) is configured to selectively route audio from either audio source 120(A) or DSP 510(B)-1 depending on the state of a control signal configured to control an internal switch and a pair of multiplexors (muxes). When that control signal is low and the switch is thus closed, routing circuit 600(A) routes an audio signal from audio source 120(A) to output element 240(A) via the pair of muxes, and also outputs that audio signal to DSP 510(B)-1 across sublink 234. When the control signal is high and the switch is thus open, routing circuit 600(A) receives an audio signal from DSP 510(B)-1 via sublink 234 and the pair of muxes for output to user 160(A) via output element 240(A).

Similar to routing circuit 600(A), Routing circuit 600(B) is configured to selectively route audio from either audio source 120(B) or DSP 510(A)-1 depending on the state of an analogous control signal and analogous pair of muxes. When the control signal is low (switch is closed), routing circuit 600(B) routes an audio signal from audio source 120(B) to output element 240(B) via the pair of muxes, and also outputs that audio signal to DSP 510(A)-1 across sublink 234. When the control signal is high (switch is open), routing circuit 600(B) receives an audio signal from DSP 510(A)-1 via sublink 234 and the pair of muxes for output to user 160(B) via output element 240(B).

Figure 7A:
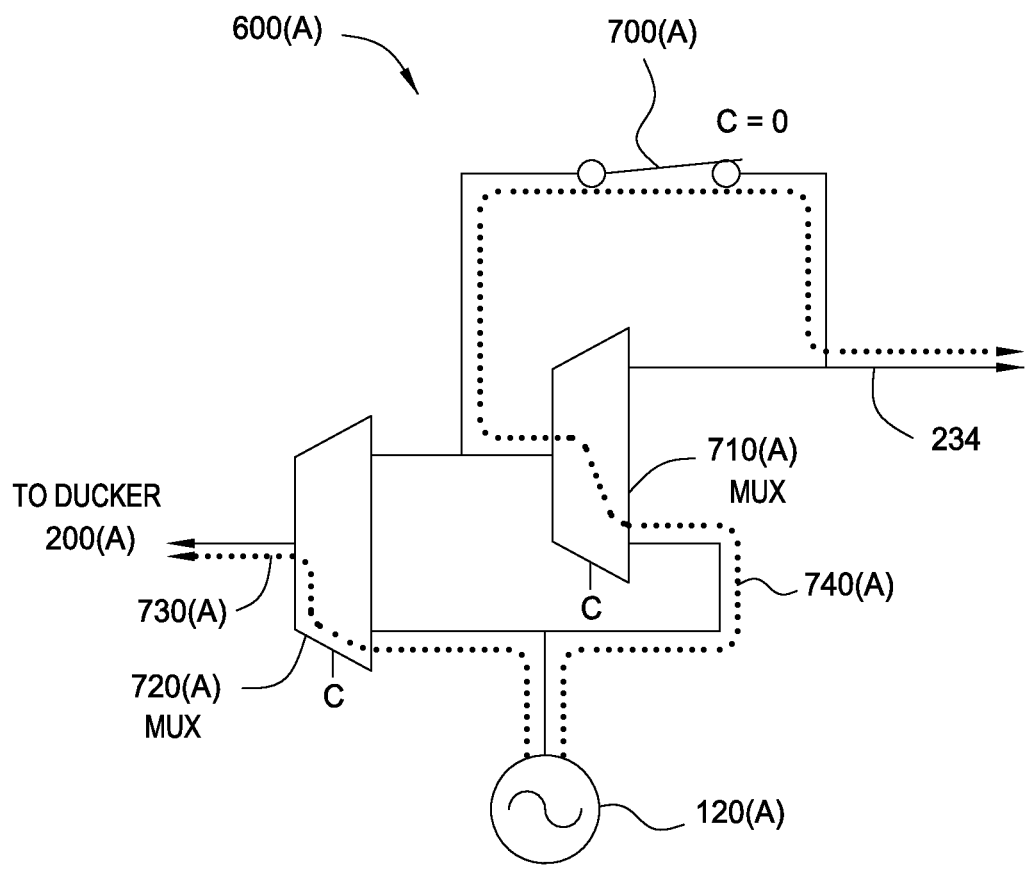
FIGS. 7A-7B illustrate one of the routing circuits of FIG. 6 configured to route audio from different sources, according to various embodiments.

Generally, routing circuits 600(A) and 600(B) operate in similar fashion. For exemplary purposes, FIGS. 7A-7B illustrate routing circuit 600(A) when the control signal is low and when that control signal is high, respectively. Persons skilled in the art will recognize that the functionality described in conjunction with those figures is also applicable to routing circuit 600(B).

FIG. 7A illustrates routing circuit 600(A) of FIG. 6 configured to route an audio signal from audio source 120(A), according to various embodiments. As shown routing circuit 600(A) includes switch 700(A) coupled to mux 710(A) and to mux 720(A). Muxes 710(A) and 720(A) are both coupled to audio source 120(A). Mux 710(A) is coupled to sublink 234, and mux 720(A) is coupled to ducker 200(A) (not shown here). Control signal C selects the state of switch 700(A) as well as that of muxes 710(A) and 720(A).

When control signal C is zero, switch 700(A) is closed, as is shown, and each of muxes 710(A) and 720(A) selects the lower pathway. Accordingly, an audio signal from audio source 120(A) travels along path 730(A) to ducker 200(A) for output to user 160(A) via output element 240(A). The audio signal also travels along path 740(A) to DSP 510(B)-1 via sublink 234 for output to user 160(B) via output element 140(B). In this configuration, DSP 510(A)-1 shares audio from audio source 120(A) with DSP 510(B)-1 for output to user 160(B), while also outputting that audio to user 160(A).

Figure 7B:
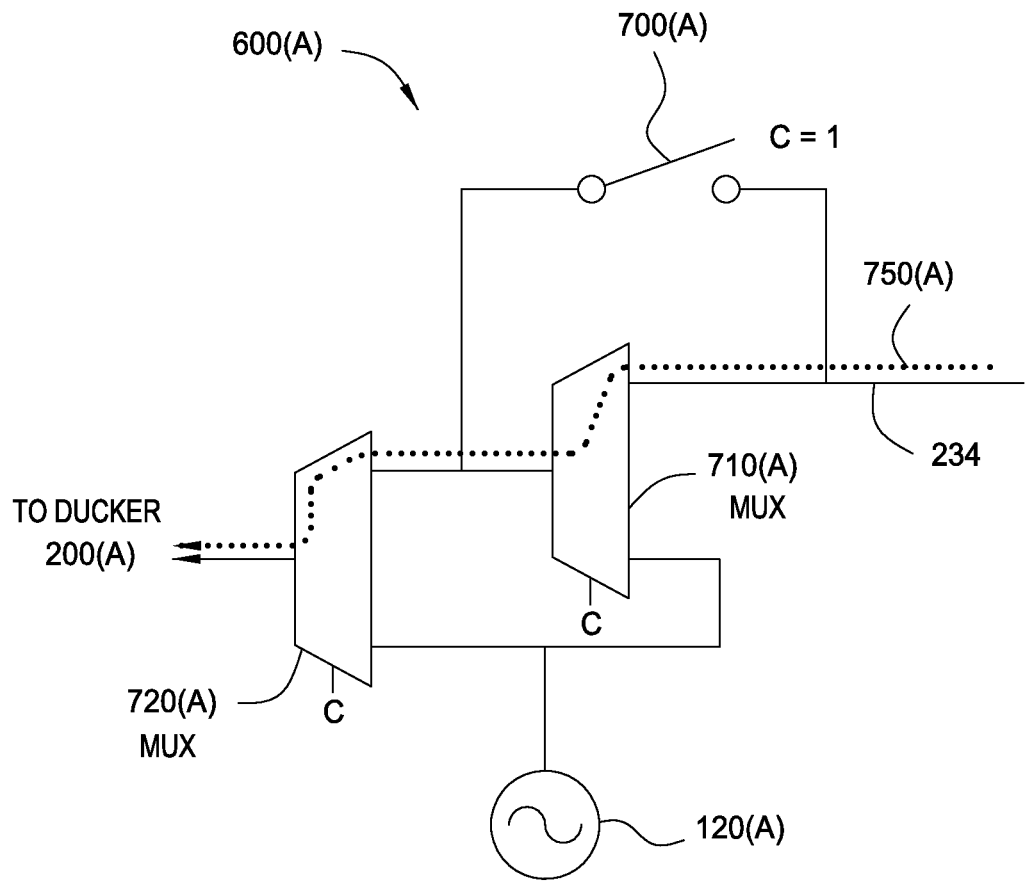

FIG. 7B illustrates routing circuit 600(A) configured to route an audio signal derived from audio source 120(B), according to various embodiments. When control signal C is one, switch 700(A) is open, as is shown, and each of muxes 710(A) and 720(A) selects the upper pathway. Accordingly, an audio signal may be received from DSP 510(B)-1 via sublink 234. Generally that audio signal originates from audio source 120(B). The received audio signal then travels along path 750(A) to ducker 200(A) for output to user 160(A) via output element 240(A). In this configuration, audio source 120(A) is bypassed, and DSP 510(A)-1 receives audio from audio source 120(B).

Referring generally to FIGS. 6-7B, the control signals associated with routing circuits 600(A) and 600(B) collectively have four distinct states, although only three of those states are typically used. In a first state, routing circuit 600(A) is configured with C=0 and routing circuit 600(B) with C=1, allowing user 160(A) to listen to audio source 120(A) and to share that audio source with user 160(B). In a second state, routing circuit 600(A) is configured with C=1 and routing circuit 600(B) with C=0, allowing user 160(B) to listen to audio source 120(B) and to share that audio source with user 160(A). In a third state, routing circuit 600(A) is configured with C=0 and routing circuit 600(B) with C=0, allowing users 160(A) and 160(B) to listen to audio sources 120(A) and 120(B), respectively. In the less commonly used fourth state, both routing circuits 600(A) and 600(B) may be configured with C=1, although in this configuration neither user receives audio from either audio source 120(A) or 120(B). However, this state may be implemented to allow communication between users without introducing audio from those audio sources 120.

The state of the control signals within routing circuits 600(A) and 600(B) may be directly controlled by users 160(A) and 160(B), or may be controlled via control circuits coupled to those routing circuits, as discussed in greater detail below in conjunction with FIG. 8. Users 160(A) and 160(B) could, for example, and without limitation, manually press a button to accomplish the desired routing of music, or, alternatively, the aforementioned control circuits could determine a proper routing based on which audio source 120(A) or 120(B) is currently active. In particular, if just one of audio sources 120(A) or 120(B) is currently active, then the control circuits may configure the control signals within routing circuits 600(A) and 600(B) to route audio only from that audio source. The switching techniques described in conjunction FIGS. 6-7B may also be combined with the filtering techniques described above in conjunction with FIG. 3 to produce yet another embodiment of DSPs 510(A) and 510(B), described below in conjunction with FIG. 8.

Figure 8:
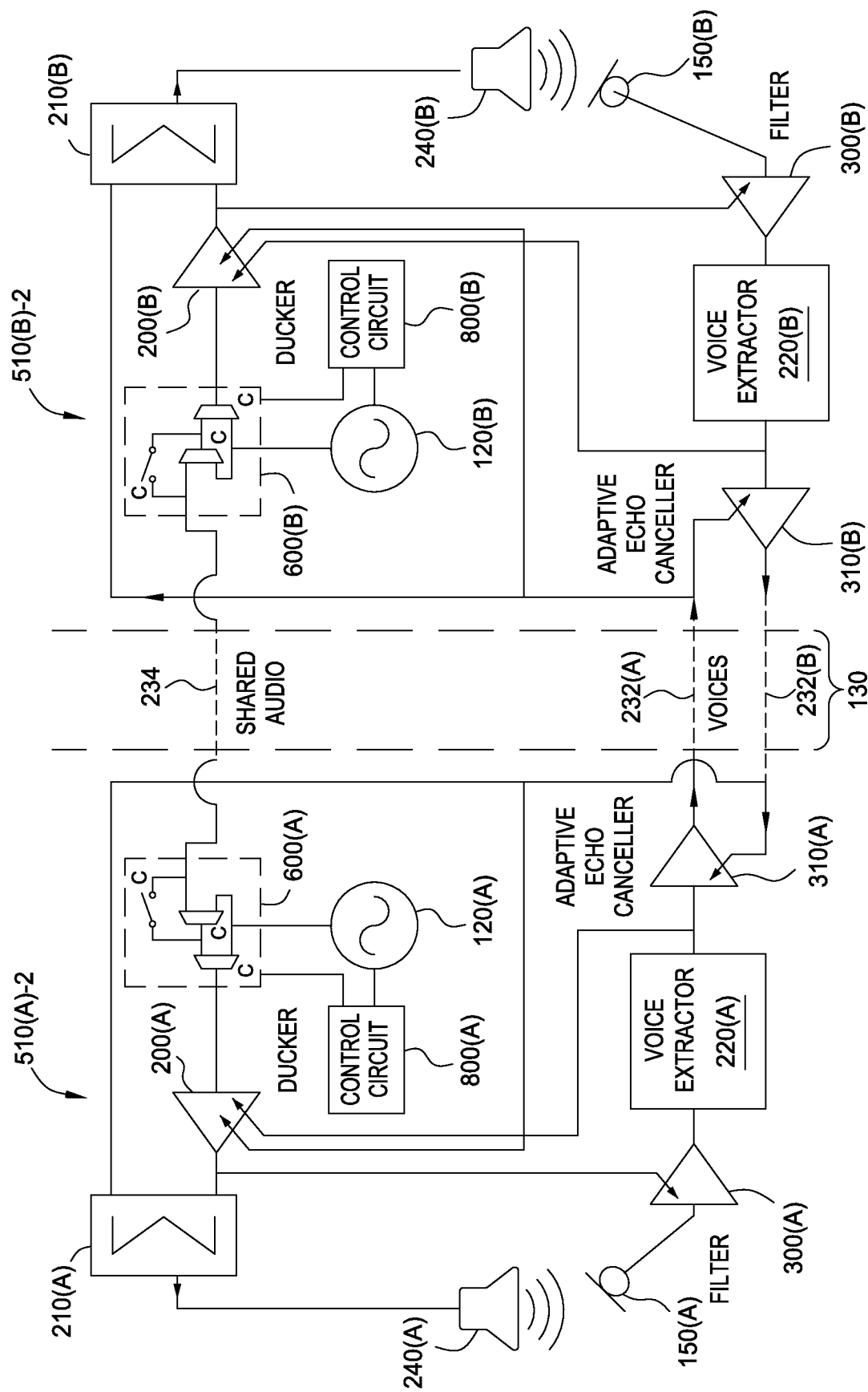
FIG. 8 illustrates another implementation where the DSPs of FIG. 5 are configured to perform a variety of signal processing operations when sharing audio and speech signals between users, according to various embodiments.

FIG. 8 illustrates another implementation where the DSPs of FIG. 5 are configured to perform a variety of signal processing operations when sharing audio and speech signals between users, according to various embodiments. In FIG. 8, microphones 150(A) and 150(B) generally reside internal to the ear canals of users 160(A) and 160(B), respectively. For example, and without limitation, microphones 150(A) and 150(B) could be bone microphones disposed within headphones 140(A) and 140(B) and configured to detect vibrations within the ear canals of users 160(A) and 160(B). Persons skilled in the art will understand that alternative implementations of microphones 150(A) and 150(B) also fall within the scope of the present invention.

As shown, DSPs 510(A)-2 and 510(B)-2 incorporate the elements of DSPs 110(A)-2 and 110(B)-2, respectively, shown in FIG. 3, as well as routing circuits 600(A) and 600(B) of DSPs 510(A)-1 and 510(B)-1, respectively, shown in FIG. 6.

DSPs 510(A)-2 and 510(B)-2 also include control circuits 800(A) and 800(B) coupled to routing circuits 600(A) and 600(B) and audio sources 120(A) and 120(B), respectively. Control circuits 800(A) and 800(B) may be hardware or software units, or a combination thereof. Control circuits 800(A) and 800(B) are configured to adjust the state of the switches and muxes within routing circuits 600(A) and 600(B) based on the state of audio sources 120(A) and 120(B). In one embodiment, control circuits 800(A) and 800(B) may be signal detectors configured to detect which audio source 120(A) and/or 120(B) is active.

In operation, control circuits 800(A) and 800(B) may set the state of the control signals associated with routing circuits 600(A) and 600(B) so that audio is routed to each user 160(A) and 160(B) in a particular fashion. For example, and without limitation, if only one audio source 120 is active, control circuits 800(A) and 800(B) could interoperate to set those control signals to route audio from the active audio source to both users 160(A) and 160(B). Alternatively, if both audio sources 120 are active, control circuits 800(A) and 800(B) could permit manual configuration of the control signals, thereby allowing users 160(A) and 160(B) to individually select the desired audio source.

Figure 9:
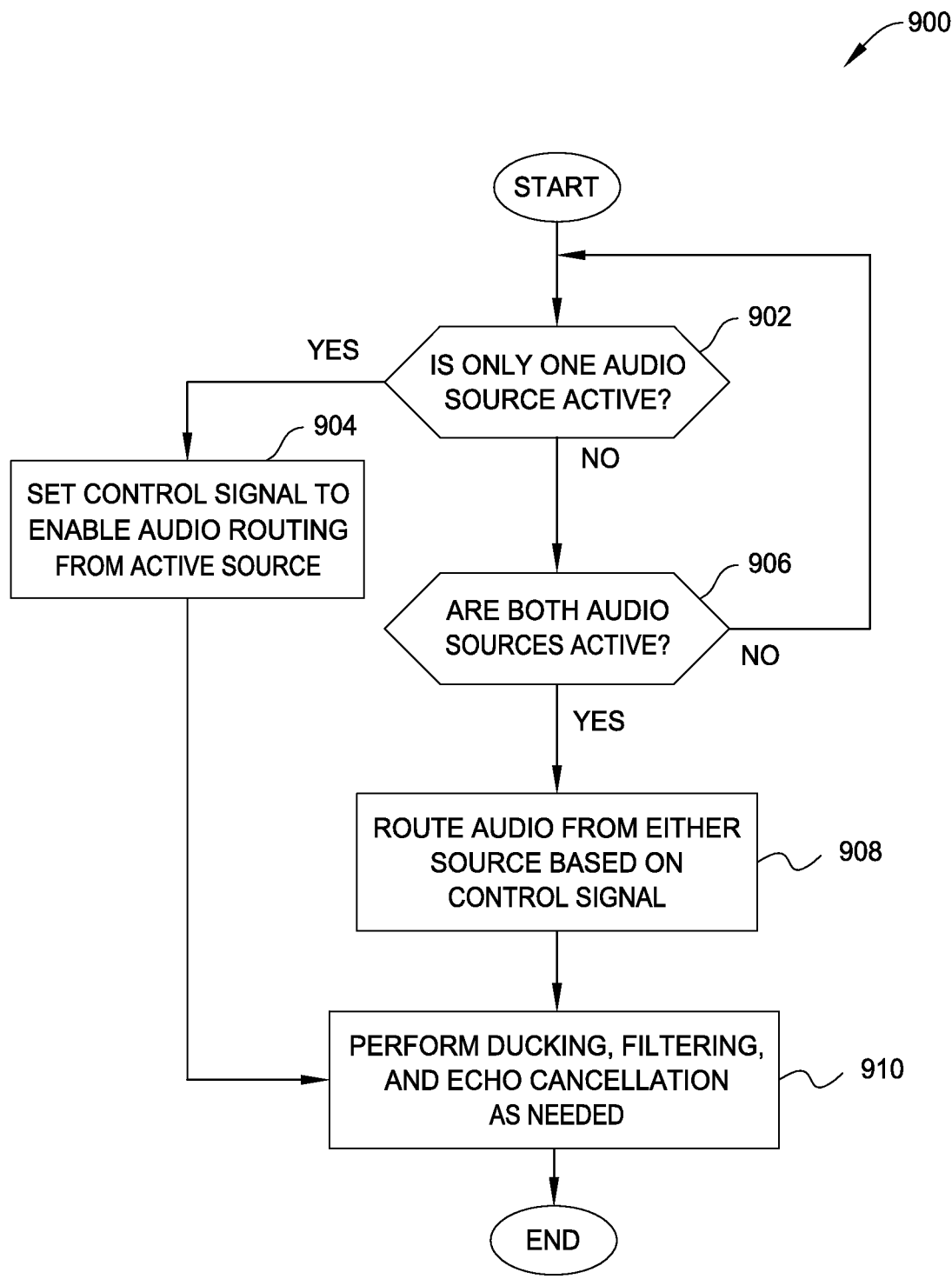
FIG. 9 is a flow diagram of method steps for selecting between audio sources associated with different users, according to various embodiments.

Similar to DSPs 110(A) and 110(B), DSPs 510(A)-2 and 510(B)-2 allows users 160(A) and 160(B) to communicate with one another via microphones 150(A) and 150(B), respectively, without interfering with audio derived from audio sources 120(A) and 120(B), by virtue of duckers 200(A) and 200(B). Duckers 200(A) and 200(B) may be configured to duck some or all audio. In the embodiment described herein, duckers 200(A) and 200(B) may be full band duckers configured to duck audio across low, mid, and high ranges. DSPs 510(A)-2 and 510(B)-2 also include filters 300(A) and 300(B) configured to reduce interference, and adaptive echo cancellers 310(A) and 310(B) for reducing echo during such communication, as previously described. In addition, DSPs 510(A)-2 and 510(B)-2 allow users 160(A) and 160(B) to select between audio sources 120(A) and 120(B) via routing circuits 600(A) and 600(B), as mentioned above. In short, DSPs 510(A)-2 and 510(B)-2 combine the various features and functionality of the different embodiments of DSPs 110(A) and 110(B) and 510(A) and 510(B) described in conjunction with FIGS. 1-7B. FIG. 9 discusses the functionality of DSPs 510(A)-2 and 510 (B)-2 in stepwise fashion.

FIG. 9 is a flow diagram of method steps for selecting between audio sources associated with different users, according to various embodiments. Although the method steps are described in conjunction with the system of FIGS. 1-3 and 5-8, persons skilled in the art will understand that any system configured to perform the method steps, in any order, is within the scope of the present invention.

In practice, either DSP 510(A)-2 or 510(B)-2 may perform all or some of the method steps discussed below. However, for simplicity with respect to describing FIG. 9, the method steps are discussed as being performed by DSP 510(A)-2.

As shown, a method 900 begins at step 902, where control circuit 800(A) determines whether only one of audio sources 120(A) and 120(B) is active. Control circuit 800(A) may be a signal detector coupled to audio source 120(A) and configured to determine the state of audio source 120(A). Control circuit 800(A) may also be coupled to audio source 120(B) or configured to interoperate with control circuit 800(B) for the sake of determining whether audio source 120(B) is active.

If, at step 902, control circuit 800(A) determines that one and only one audio source 120 is active, then the method 900 proceeds to step 904. At step 904, control circuit 800(A) sets control signal C to enable routing of an audio signal from the active audio source. If audio source 120(A) is active, and audio source 120(B) is not active, then control circuit 800(A) sets C=0, thereby closing switch 700(A) within routing circuit 600(A) and coupling audio source 120(A) to output element 240(A) via muxes 710(A) and 710(B). Alternatively, if audio source 120(B) is active, and audio source 120(A) is not active, then control circuit 800(A) sets C=1, thereby opening switch 700(A) within routing circuit 600(A) and coupling audio source 120(B) to output element 240(A) via muxes 710(A) and 720(B). Control circuit 800(B) operates in like fashion as control circuit 800(A), and so in situations where audio source 120(B) is active, control circuit 800(B) configures the analogous control signal to enable routing along sublink 234. The method 900 then proceeds to step 910.

At step 910, DSP 510(A)-2 performs various ducking, filtering, and echo cancellation in order to process audio and speech signals prior to output to users 160(A) and 160(B). As a general matter, at step 910, DSP 510(A)-2 may perform any of the techniques described above in conjunction with FIGS. 1-4.

Returning to step 902, if control circuit 800(A) determines that neither audio source 120 is active, or determines that more than one audio source is active, then the method proceeds to step 906. At step 906, control circuit 800(A) determines whether both audio sources 120 are active. If neither audio source is active, then the method 900 repeats until either one or both audio sources 120 becomes active. Otherwise, the method 900 proceeds to step 908.

At step 908, control circuit 800(A) causes routing circuit 600(A) to route audio from either audio source 120(A) or 120(B) depending on control signal C. Control signal C selects between audio source 120(A) or 120(B). The method 900 then proceeds to step 910 and proceeds as described above.

By implementing the method 900, DSPs 510(A)-2 and 510(B)-2 allow users 160(A) and 160(B) to select between different stereo audio sources, thereby further expanding the functionality of those DSPs. Since DSPs 510(A)-2 and 510(B)-2 include similar signal processing hardware as described in conjunction with FIGS. 1-3, those DSPs may enable high-quality communication between users 160(A) and 160(B) with reduced interference, noise, echo, and so forth. Persons skilled in the art will recognize that the different implementations of DSPs 110(A), 510(A), 110(B), and 510(B) described herein may be linked together to implement certain functionalities. For example, DSP 110(A)-1 could be linked to DSP 510(B)-2 to allow communication between users 160(A) and 160(B), and enable the sharing of music between users. Generally, any technically feasible linking of the DSPs described herein falls within the scope of the disclosed embodiments.

In sum, a first digital signal processor (DSP) associated with a first user outputs audio to the first user via a first set of headphones, and captures speech from the first user via a first microphone. Similarly, a second DSP associated with a second user outputs audio to the second user via a second set of headphones, and captures speech from the second user via a second microphone. The first DSP is coupled to the second DSP in order to allow the first and second users to share music and communicate with one another. The first user may speak into the first microphone, and the first and second DSPs may then interoperate to output that speech to the second user without substantially disrupting audio output to the second user. The two DSPs also interoperate to reduce interference and echo potentially caused by feedback. Each of the first and second users may select between a first audio source coupled to the first DSP and a second audio source coupled to a second DSP.

At least one advantage of the disclosed embodiments is that two users who wish to listen to the same stereo audio may do so without disrupting the stereo nature of that audio. In addition, those users may remain in communication with one another despite having both the left and right ears occluded by headphones. Further, interference and echo potentially caused by feedback may be reduced, thereby promoting a positive user experience without distracting sounds. Finally, both users may also select between different audio sources, allowing the users to listen to the same audio or to listen to different audio, while remaining in communication with one another.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A system for accessing audio signals from two different audio sources, the system comprising:
    a first routing circuit coupled to a first audio source and including a first multiplexor and a second multiplexor; and
    a first output element coupled to the first routing circuit, wherein, in a first state:
        the first routing circuit is configured to route an audio signal from the first audio source to a first output element for output, and
        the first multiplexor is configured to pass the audio signal from the first audio source to the first output element, and
    wherein, in a second state:
        the first routing circuit is configured to route an audio signal from a second audio source to the first output element for output,
        the second multiplexor is configured to pass the audio signal from the second audio source to the first multiplexor, and
        the first multiplexor is configured to pass the audio signal from the second audio source to the first output element.

2. The system of claim 1, wherein, in the second state, the first multiplexor is configured to not pass the audio signal from the first audio source to the first output element.

3. The system of claim 2, wherein the first routing circuit further includes a switch that controls configurations of the first multiplexor and the second multiplexor in the first state and the second state as well as how the audio signal from the first audio source and the audio signal from the second audio source are routed through the first routing circuit.

* * * * *